(12) United States Patent
Hichri et al.

(10) Patent No.: US 8,030,157 B1
(45) Date of Patent: Oct. 4, 2011

(54) LINER PROTECTION IN DEEP TRENCH ETCHING

(75) Inventors: Habib Hichri, Poughkeepsie, NY (US); Ahmad D. Katnani, Poughkeepsie, NY (US); Kaushik A. Kumar, Rensselaer, NY (US); Narender Rana, Highland, NY (US); Richard S. Wise, Newburgh, NY (US); Hakeem B. S. Akinmade-Yusuff, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/782,050

(22) Filed: May 18, 2010

(51) Int. Cl.
*H01L 21/8242* (2006.01)
(52) U.S. Cl. ........................................ 438/248
(58) Field of Classification Search .................. None
See application file for complete search history.

(56) References Cited

U.S. PATENT DOCUMENTS

| | | | |
|---|---|---|---|
| 4,918,027 A | 4/1990 | Fuse et al. | |
| 4,984,039 A * | 1/1991 | Douglas | 257/301 |
| 5,118,636 A | 6/1992 | Hosaka | |
| 6,207,494 B1 * | 3/2001 | Graimann et al. | 438/248 |
| 6,764,922 B2 | 7/2004 | Beyer et al. | |
| 7,375,392 B1 | 5/2008 | Chen et al. | |
| 2005/0064678 A1 * | 3/2005 | Dudek et al. | 438/424 |
| 2006/0079068 A1 | 4/2006 | Sheu et al. | |
| 2008/0150037 A1 | 6/2008 | Teo et al. | |
| 2009/0203197 A1 * | 8/2009 | Hanawa et al. | 438/513 |
| 2009/0286380 A1 | 11/2009 | Kim et al. | |

* cited by examiner

*Primary Examiner* — Charles Garber
*Assistant Examiner* — Andre' Stevenson
(74) *Attorney, Agent, or Firm* — Cantor Colburn LLP; Ian MacKinnon

(57) ABSTRACT

A method of forming a trench in a semiconductor device formed of a substrate and a first layer formed over the substrate includes forming an initial trench that passes through the first layer to the substrate, the initial trench having a diameter that decreases from a first diameter to a second diameter, the second diameter being measured at a distance closer to the substrate than the first diameter; exposing the trench to a dopant via an orthogonal ion implant to form doped regions sidewalls of the trench; and etching the trench to remove at least some of the doped regions.

8 Claims, 3 Drawing Sheets

LINER PROTECTION IN DEEP TRENCH ETCHING

BACKGROUND

The present invention relates to semiconductors and, and more specifically, to forming semiconductor wafers having deep trenches.

Semiconductor wafers may include a base substrate layer covered by one or more layers (upper layers) formed on top of the base substrate. It may be required, in some instances, to etch the substrate after the other layers have been deposited over it. To that end, a trench is formed through the upper layers to expose the substrate layer. In some instances, a liner material is deposited on the sides of the trench before the substrate is etched.

In some cases, the substrate may be etched by a plasma etching process. The etching plasma components and sputtered material erode may the liner. This may be noticed particularly at the bottom of trench where the BOX-Si interface structure may be undercut leading to structural damage causing leakage and yield issues. This is inherent in the available plasma etch tools. Indeed, dielectric chambers are limited to fluorocarbon chemistry due to chamber materials and to provide anisotropy during silicon oxide etch. One solution is to apply a thicker liner material. The thicker liner material may reduce the width of the hole and, therefore, increase size.

SUMMARY

According to one embodiment of the present invention, a method of forming a trench in a semiconductor device formed of a substrate and a first layer formed over the substrate is disclosed. The method includes forming an initial trench that passes through the first layer to the substrate, the initial trench having a diameter that decreases from a first diameter to a second diameter, the second diameter being measured at a distance closer to the substrate than the first diameter; exposing the trench to a dopant via an orthogonal ion implant to form doped regions sidewalls of the trench; and etching the trench to remove at least some of the doped regions.

According to another embodiment of the present invention, a semiconductor device that includes a substrate and a first layer disposed over the substrate is disclosed. The first layer has in this embodiment been exposed to an orthogonal doping procedure and an etching procedure to remove at least some non-vertical portions therefrom.

According to yet another embodiment of the present invention, a semiconductor device that includes a substrate and a first layer formed over the substrate is disclosed. The first layer includes initial trench that passes through the first layer to the substrate that was formed having a diameter that decreases from a first diameter to a second diameter, the second diameter being measured at a distance closer to the substrate than the first diameter, and wherein the trench was exposed to a dopant via an orthogonal ion implant to form doped regions sidewalls of the trench and etched to remove at least some of the doped regions.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As discussed above, a substrate may be etched by a plasma etching process that causes erosion of the liner covering upper layers disposed over the substrate. It has been discovered that such erosion may be more prevalent at the junction of two layers due to the non-vertical edges created at these locations. Accordingly, embodiments of the present invention may remove or reduce non-vertical edges within a trench.

In one embodiment, the one or more layers forming the walls of the trench may be orthogonally exposed to an appropriate dopant and concentration variation (e.g., doped with an n-type dopant such as arsenic) so that the doped portion may be selectively removed. This will selectively reduce non-vertical components of the trench and result in less angle of incidence for attack of the liner during subsequent processing steps.

Figure 1:
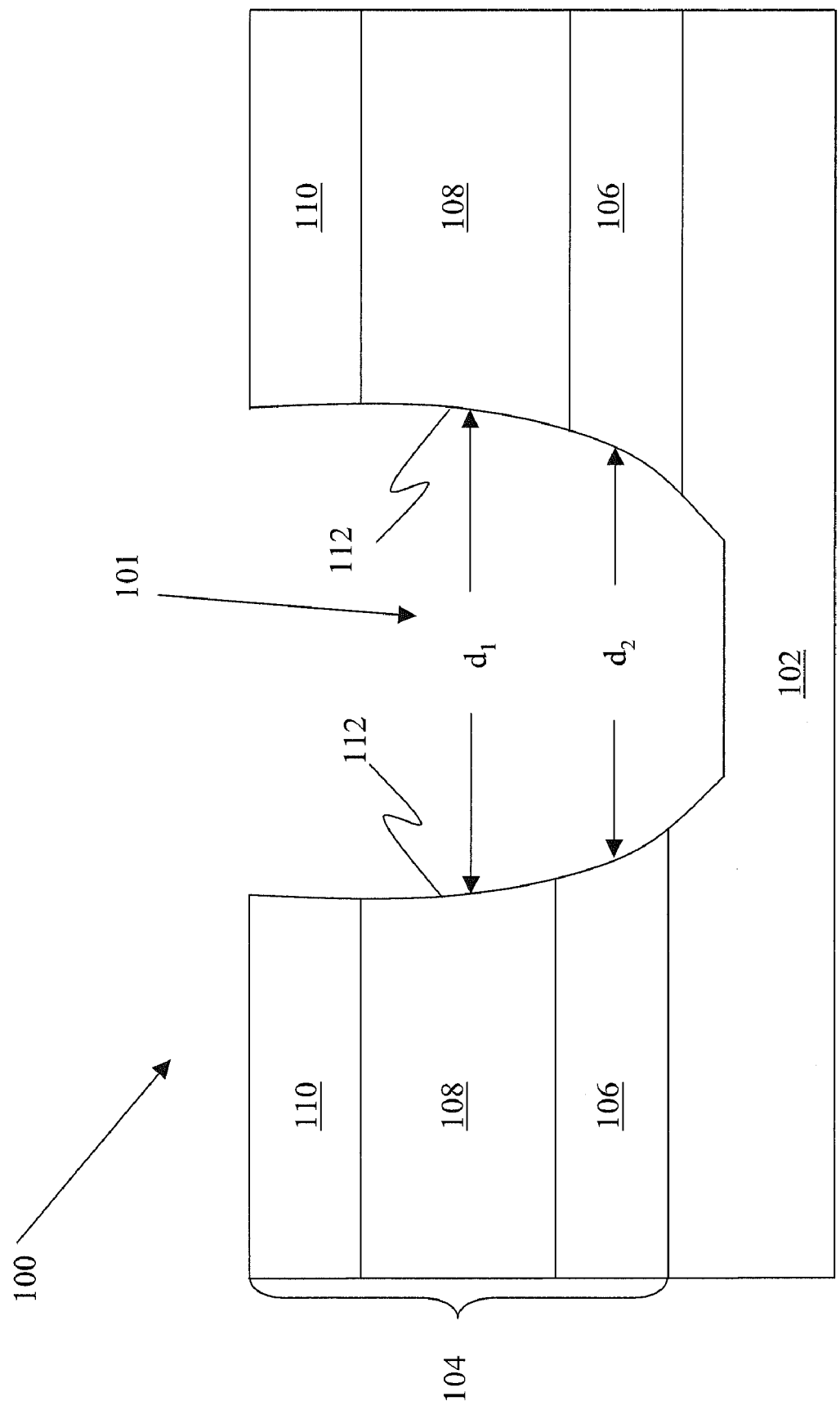
FIG. 1 shows an example of a workpiece having a trench formed therein.

FIG. 1 shows an example of a workpiece 100 having a trench 101 formed therein. The workpiece 100 may include a substrate 102. On top of the substrate one or more upper layers 104 are disposed. In the example shown in FIG. 1, the upper layers 104 may include a first upper layer 106 disposed over the substrate 102. The upper layers 104 may also include a second upper layer 108 disposed over the first upper first upper layer 106 and a third upper layer 110 disposed over the second upper layer 108. Of course the number of layers is not limited to the three layers shown in FIG. 1. In one embodiment, only the first upper layer may be included. In one embodiment, the first upper layer 106 may be a buried oxide (BOX) layer. In one embodiment, the substrate 102 is silicon substrate and the upper layers 104 may include a silicon oxide layer and a pad nitride layer all covered by a sacrificial layer.

The trench 101 passes completely through at least one layer of the upper layers 104. In one embodiment, the trench passes completely through all of the upper layers 104 so to expose at least a portion of the substrate 102.

Depending on the depth of the trench 101 or the available processing means, the situation may exist where the walls 112 of the trench 101 curve inward narrowing the diameter of the trench 101 from the a first diameter $d_1$ to a second diameter $d_2$. The second diameter $d_2$ is measured at a location closer to the substrate 102 than the first diameter $d_1$.

As discussed above, if the curved walls 112 are covered by a liner layer, subsequent processing may cause holes or other damage to be formed in the liner layer. Accordingly, in one embodiment of the present invention, the walls 112 are made more vertical. Stated differently, in one embodiment, the curvature of the walls 112 is reduced making the values of $d_1$ and $d_2$ closer to one another.

Figure 2:
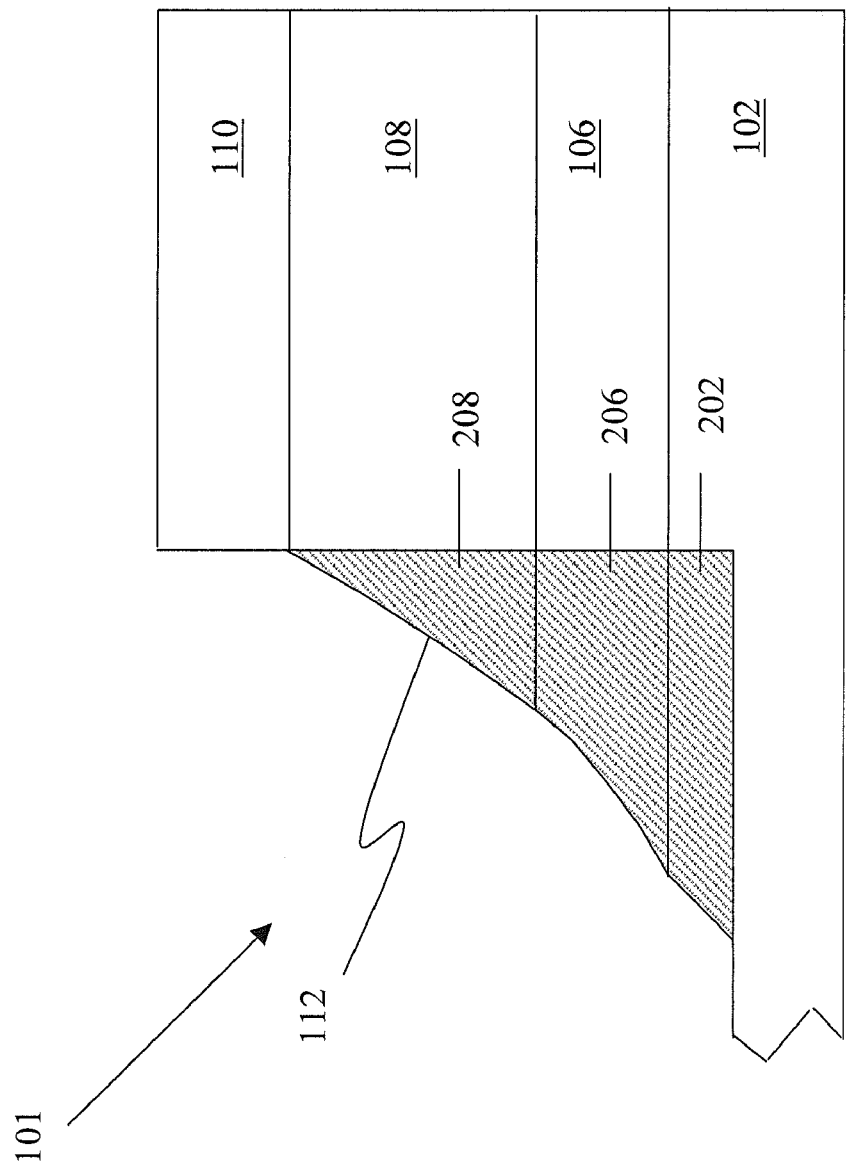
FIG. 2 shows the workpiece of FIG. 1 after being exposed to an orthogonal doping procedure.

FIG. 2 shows a close up one of the sides of the trench 101 shown in FIG. 1 after being exposed to a. The sides of the trench 101 are exposed to an orthogonal ion implant as indicated by arrows 200. In one embodiment, the ion implant 200 causes the non-vertical portions of the curved walls to be N-doped. This may be accomplished by doping the non-vertical portions with arsenic. Of course, other dopants could utilized.

The result of orthogonal doping is that at least a portion of the non-vertical portions of the sidewalls become doped. As shown in FIG. 2, the substrate 102 has a doped portion 202, the first upper layer 106 has a doped portion 206 and the second upper layer 108 has a doped portion 208. In one embodiment, the doped portions 202, 206 and 208 are N-doped. The size of the doped portions on each level may vary from that shown in FIG. 2.

Figure 3:
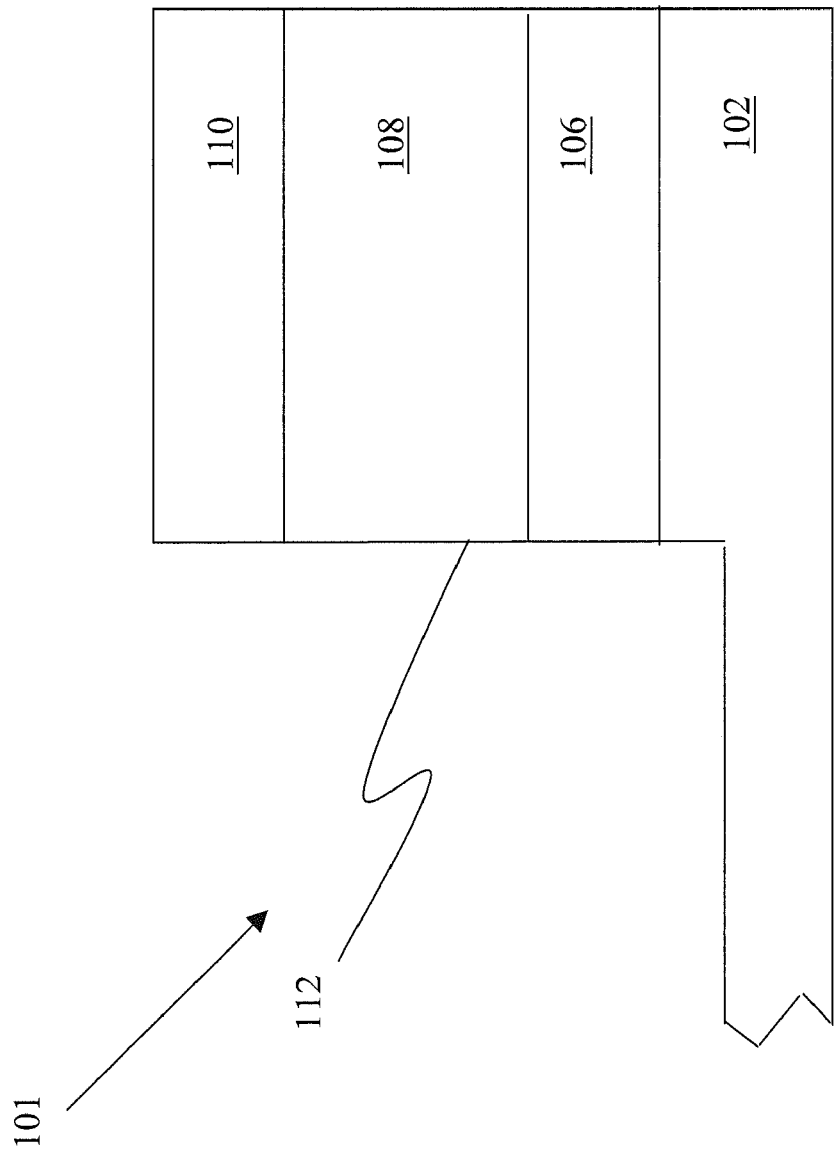
FIG. 3 shows the workpiece of FIG. 2 after the trench sidewalls have been made more vertical by removing the doped portions.

FIG. 3 shows the trench 101 after it has been etched to remove the doped portions. The sidewalls 112 are more vertical than in FIG. 1. As shown, the sidewalls 112 are perfectly vertical. Of course, some curvature may still exist. In one embodiment, the processing described with respect to FIG. 2 may be repeated if desired.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a trench in a semiconductor device formed of a substrate and a first layer formed over the substrate, the method comprising:
    forming an initial trench that passes through the first layer to expose the substrate, the initial trench having a diameter that decreases from a first diameter to a second diameter, the second diameter being measured at a distance closer to the substrate than the first diameter;
    exposing the trench to a dopant via an orthogonal ion implant to form doped regions on sidewalls of the trench; and
    etching the trench to remove at least some of the doped regions.

2. The method of claim 1, wherein etching increases the second diameter.

3. The method of claim 2, wherein the second diameter is increased to equal the first diameter.

4. The method of claim 1, further comprising:
    repeating the exposing and etching.

5. The method of claim 1, wherein the dopant in an n-type dopant.

6. The method of claim 5, wherein the dopant is arsenic.

7. The method of claim 1, wherein the substrate is silicon and the first layer includes several sub-layers.

8. The method of claim 7, wherein the sub-layers include a buried oxide layer, a silicon oxide layer and a nitride layer.

* * * * *